United States Patent [19]

Dalamangas et al.

[11] 4,257,661
[45] Mar. 24, 1981

[54] RETAINER FOR ELASTOMERIC ELECTRICAL CONNECTOR

[75] Inventors: Chris A. Dalamangas, Union; Thomas P. Piccirillo, North Plainfield, both of N.J.

[73] Assignee: Technical Wire Products, Inc., Cranford, N.J.

[21] Appl. No.: 34,954

[22] Filed: Apr. 30, 1979

Related U.S. Application Data

[63] Continuation of Ser. No. 846,344, Oct. 28, 1977, abandoned.

[51] Int. Cl.³ .............................................. H01R 13/20
[52] U.S. Cl. ......................... 339/75 MP; 339/17 CF; 339/DIG. 3
[58] Field of Search .......... 339/17 CF, 75 M, 75 MP, 339/176 MP, DIG. 3

[56] References Cited

U.S. PATENT DOCUMENTS

| | | | |
|---|---|---|---|
| 3,795,037 | 3/1974 | Luttmer | 339/17 M |
| 3,815,077 | 6/1974 | Anhalt et al. | 339/17 CF |
| 3,885,173 | 5/1975 | Lee | 339/17 CF |
| 3,960,424 | 6/1976 | Weisenburger | 339/17 M |
| 4,008,300 | 2/1977 | Ponn | 339/17 M |
| 4,008,938 | 2/1977 | Anhalt et al. | 339/17 LM |
| 4,063,791 | 12/1977 | Cutchaw | 339/75 MP |
| 4,064,623 | 12/1977 | Moore | 339/DIG. 3 |

Primary Examiner—Joseph H. McGlynn
Attorney, Agent, or Firm—Quaintance, Murphy & Richardson

[57] ABSTRACT

A retainer for retaining an elastomeric electrical connector in operable position between opposed sets of spaced electrically conductive areas has a generally planar body of electrically non-conductive material having substantially parallel top and bottom surfaces. At least one aperture through the body from the top surface to the bottom surface is provided for receiving the elastomeric electrical connector. The aperture is linearly elongated in the planar dimension of the body and has a top region and a bottom region separated by a central region. The opening of the aperture in the central region is smaller than either the top region or bottom region and is substantially identical with the width of the elastomeric electrical connector retained thereby.

4 Claims, 8 Drawing Figures

RETAINER FOR ELASTOMERIC ELECTRICAL CONNECTOR

This is a continuation of copending application Ser. No. 846,344, filed Oct. 28, 1977, now abandoned.

BACKGROUND OF THE INVENTION

1. Field of the Invention

This invention pertains generally to retainers or carrier frames for elastomeric electrical connectors. Examples of elastomeric electrical connectors which can be advantageously used in combination with the retainer of this invention are to be found in U.S. Pat. No. 4,003,621, U.S. Pat. No. 3,998,512 and particularly useful are the layered elastomeric electrical connector elements sold under the trademark ZEBRA by Technical Wire Products, Inc.

2. Description of the Prior Art

In recent years, particularly with the substantial reduction in physical dimensions of electronic components such as alpha-numeric displays, integrated circuits, and the like, the use of electrical connectors employing stamped metal contacts have begun to give way to a new class of electrical connectors employing electrically conductive elements which are not wholly metallic. Some such connectors employ electrical conductors which are themselves merely elastomers loaded with electrically conductive materials. Examples of such connectors are to be found in U.S. Pat. Nos. 3,885,173; 3,861,135; 3,648,002; and published Japanese Patent application Sho 49-765 and Sho 47-25523. Other such connectors employ extemely small and substantially linear metal conductors maintained in an array insulated from each other by a single body of elastomer. Examples of such connectors are to be found in U.S. Pat. Nos. 3,795,037; 3,795,884; 3,862,790 and 4,003,621.

These electrical connectors to a lesser or greater degree, employ elastomers as a substantial portion of the conductor-supporting matrix and may be termed generally as elastomeric electrical connectors. Since their advent, the elastomeric electrical connector has enjoyed a mixed reputation. While the connectors have permitted an ease of disassembly and reassembly not achievable through the use of conductive cements, reliability has often been lacking due to problems directly associated with contact potentials developing between the connector itself and the electrically conductive areas sought to be connected. It has usually been assumed that to overcome such problems, one merely increases the contacting area of the elastomeric connector, thereby affording a greater probability of eliminating this undesirable contact potential. This results in yet additional problems related to surface smoothness and linearity of the connector as well as durometer of the elastomers employed since an increase in contact area results in a corresponding increase in total force required to connect the components.

Particularly in connectors using the layered elastomer technique such as is illustrated in U.S. Pat. No. 3,885,173, it has been the general practice in the past to form a self-supporting layered elastomeric strip or ribbon which connects a number of mating electrically conductive areas. In order that the strip or ribbon be self-supporting, the width of the elastomeric strip or ribbon was usually equal to or greater than the dimension of separation between the two sets of electrically conductive areas sought to be connected. Since the total force which could be applied to many electrical components is rather restricted due to the materials used in their construction, the contact pressure between the elastomeric connector and the electrically conductive areas sought to be connected is rather low.

An increase in reliability of elastomeric electrical connectors could be achieved by increasing this contact pressure between the elastomeric electrical connector and the electrically conductive areas sought to be connected by simply reducing the contact area. A reduction in contact area could only be achieved by a substantial reduction in width of the connector while maintaining the same separation between the sets of contact areas. As a result, the elastomeric electrical connector could no longer be self-supporting and some means for supporting the elastomeric connector was necessary. One such support means is to be found in U.S. Pat. No. 3,998,512, which discloses simply a relatively rigid plastic support strip which supports an elastomeric connector having a very small width dimension, the support strip permitting the necessary compression of the elastomeric connector only through a very minor portion of the connector.

Additional examples of the prior art are to be found in U.S. Pat. Nos. 3,858,958; 3,760,330; 3,551,750; 3,542,939; and 3,509,296.

SUMMARY OF THE INVENTION

The present invention is directed to a supporting retainer to be used with elastomeric electrical connectors, the retainer having a support function somewhat similar to that illustrated in U.S. Pat. No. 3,998,512, yet the retainer being adaptable to a broad class of elastomeric electrical connectors of various designs. A retainer according to the present invention generally comprises a pair of separated linear sidewalls, of electrically non-conductive material, defining therebetween a space for receiving an elastomeric electrical connector. The space is characterized by two end regions separated by a central region, the central region having a sidewall-to-sidewall dimension smaller than the end regions. The sidewalls in the central region are generally parallel to each other, separated by a distance substantially identical to the width of the elastomeric connector, and may occupy anywhere from 10 to 70% of the total thickness of the retainer. It has been found that the central region preferably occupies from about 30% to about 45% of the total thickness of the retainer. While the sidewalls of the retainer in the two outer regions may have any convenient configuration, a particularly advantageous configuration is where the sidewalls linearly diverge from each other at an angle of from 5° to 50° and preferably at an angle of from 10° to 20°. An example of another configuration which may advantageously be used is where the sidewalls are continuously inwardly convex.

A retainer means of the present invention may be viewed as a generally planar body of electrically non-conductive material having substantially parallel top and bottom surfaces. At least one aperture extends through the body from the top surface to the bottom surface for receiving the elastomeric electrical connector. The aperture is linearly elongated in the planar dimension of the body and has a top and bottom region separated by a central region, the opening of the aperture in the central region being somewhat smaller than either the top or bottom region.

The retainer means according to this invention preferably has at least one pair of lands on the top surface and the bottom surface of the generally planar body adjacent the aperture for preventing over-compression of the elastomeric electrical connector retained by the retainer. The retainer can additionally have other apertures for keying the position of other electrical components or other purposes consistent with the objects of this invention. Other features and advantages of the several aspects of this invention will become apparent to those of ordinary skill in the art from the following discussion of some of the preferred embodiments, together with the accompanying figures and appended claims.

DESCRIPTION OF PREFERRED EMBODIMENTS

Figure 1:
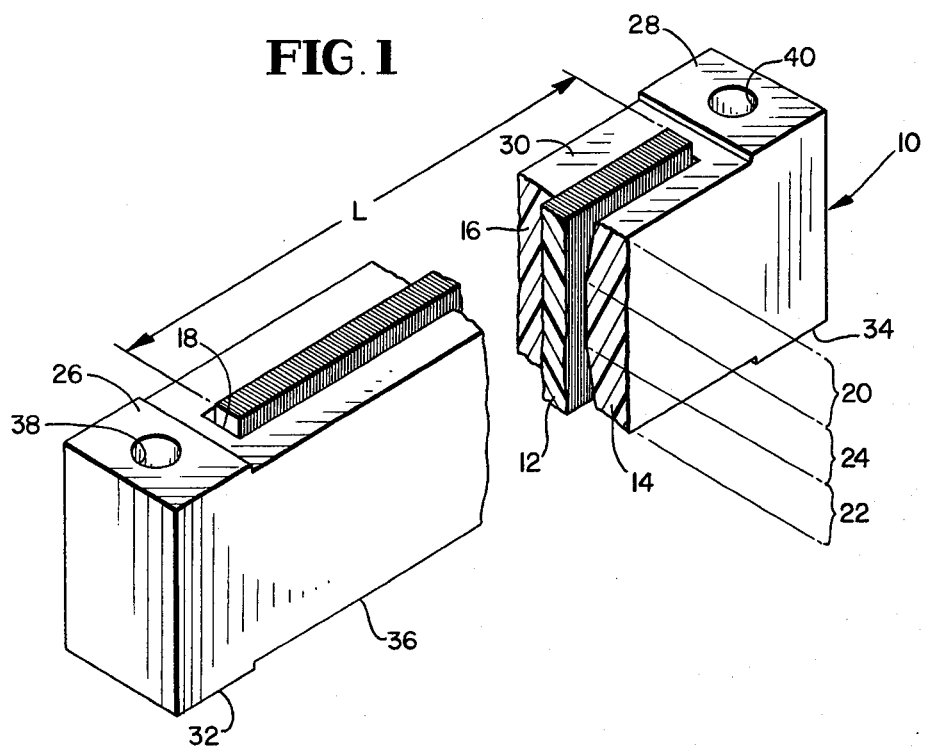
FIG. 1 is a perspective view of a retainer according to this invention retaining an elastomeric electrical connector divided through a central portion thereof for convenience of illustration.

There is illustrated in FIG. 1 of the drawings a retainer means 10 according to this invention for retaining an elastomeric electrical connector 12 the retainer 10 comprises a pair of separated linear sidewalls 14 and 16 of electrically non-conductive material which define therebetween a space 18 for receiving the elastomeric electrical connector 12. The space 18 is characterized by two end regions, a top region 20 and bottom region 22, separated by a central region 24, the central region 24 having a sidewall-to-sidewall dimension smaller than the end regions 20 or 22. Each of the sidewalls 14 and 16 are linearly elongated in the direction L. The retainer 10 further includes lands 26 and 28 on the top surface 30 and lands 32 and 34 on the bottom surface 36. Holes 38 and 40 are provided for mounting the retainer with respect to the circuits to be connected by the apparatus.

Figure 2:
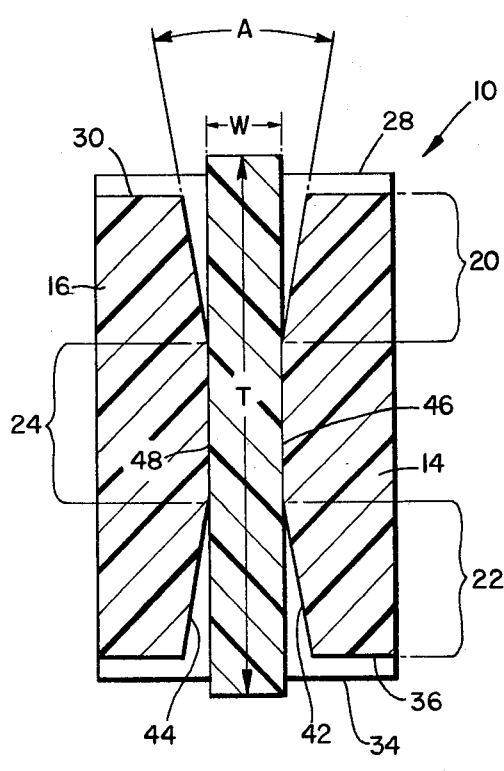
FIG. 2 is a sectional view of the retainer and the elastomeric electrical connector as illustrated in FIG. 1.

As illustrated in FIG. 2, the sidewalls 14 and 16 of the retainer means 10 are seen to have interior surfaces 42 and 44 consisting of 3 discrete planar segments corresponding to regions 20, 22 and 24. The planar segments 46 and 48 coextensive with the central region 24 are seen to be separated by a distance substantially identical to the width W of the elastomeric electrical connector 12. From planar segments 46 and 48, the sidewalls 14 and 16 diverge in both the top region 20 and bottom region 22 at an angle A. It is to be noted that the thickness dimension T of the retained elastomeric electrical connector 12 is somewhat greater than the total thickness of the retainer means as measured from the surface of land 28 to the surface of land 34.

Figure 3:
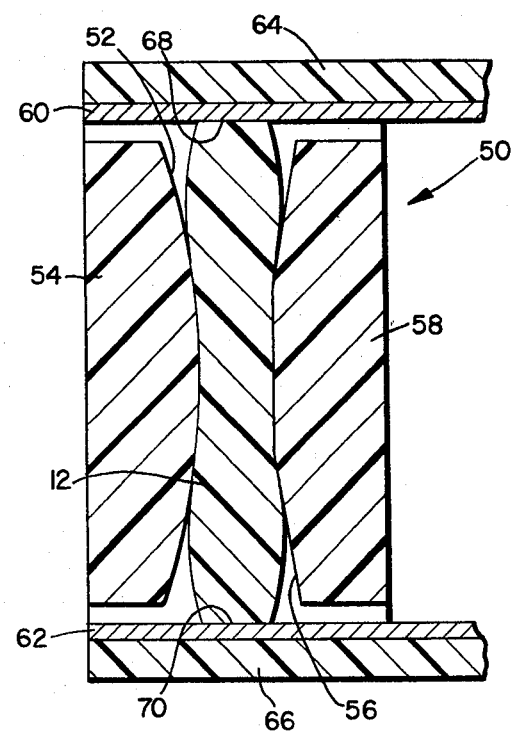
FIG. 3 is a sectional view of a retainer similar to that illustrated in FIG. 1 with certain modifications illustrating deformation of the retained elastomeric electrical connector when in use.

FIG. 3 illustrates a retainer means 50 similar in every respect to retainer means 10 except that the interior surface 52 of sidewall 54 is a continuous curve inwardly convex while the interior surface 56 of sidewall 58 continues to have the three discrete planar areas as previously discussed in connection with retainer 10. FIG. 3 further illustrates the slight deformation which the elastomeric electrical connector 12 will experience when electrical circuits 60 and 62 fixed to their respective supporting substrates 64 and 66 are brought into intimate contact with the top surface 68 and bottom surface 70 of the retained elastomeric electrical connector 12. The thickness T of the connector 12 should be selected so as to insure a satisfactory contact pressure between the connector 12 and the spaced electrically conductive areas 60 and 62. Under the pressure exerted by the contact with the electrically conductive areas 60 and 62, the elastomeric connector 12 undergoes hydrostatic compression thereby causing the width W of the elastomeric connector 12 to increase in the top region 20 and bottom region 22 as illustrated graphically in FIG. 3. This hydrostatic compression of the elastomeric member 12 insures an inherent biasing action of the electrical connector 12 against the surfaces 60 and 62.

Figure 4:
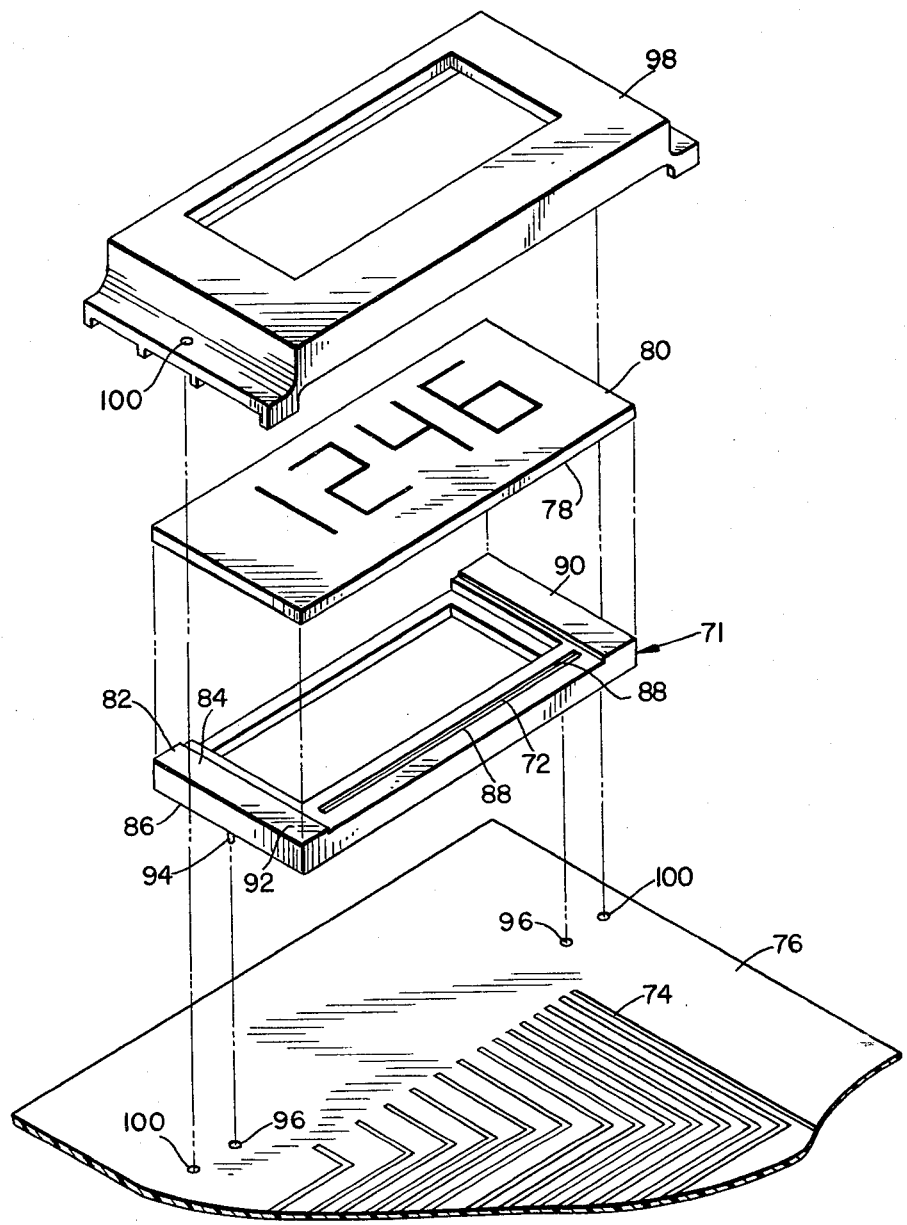
FIG. 4 is an exploded view illustrating the utilization of yet another embodiment of a retainer according to this invention for connecting an alpha-numeric display panel to an associated electrical circuit.
Figure 5:
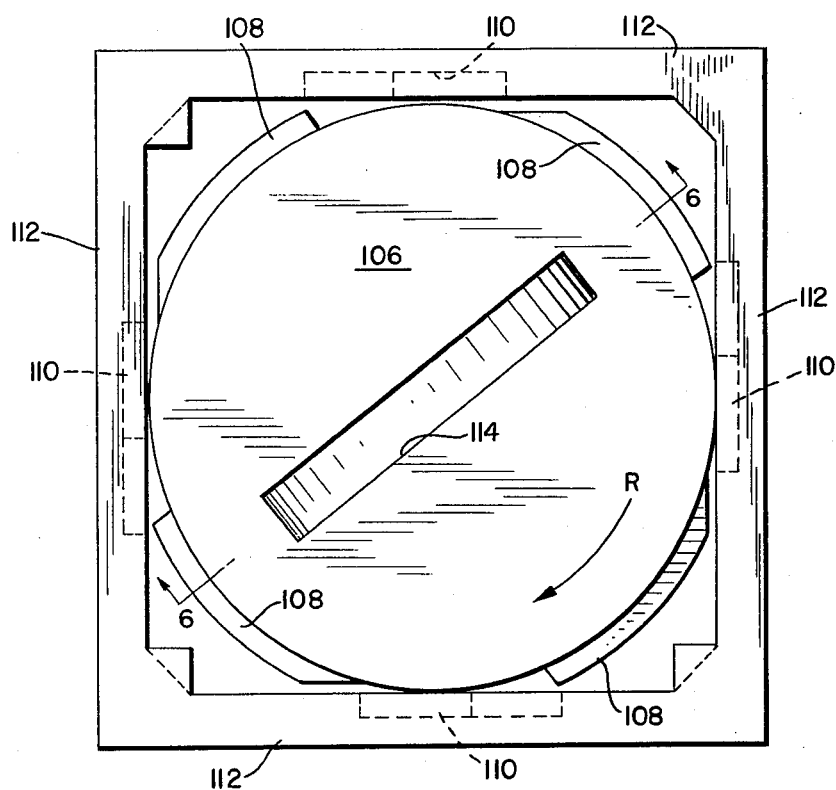
FIG. 5 is the top view of a large scale integrated circuit connector employing the several features of this invention.
Figure 6:
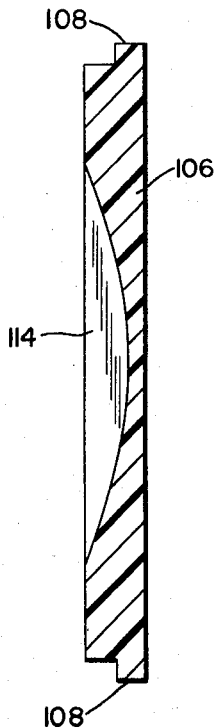
FIG. 6 is a sectional view of the cover plate taken along line 6—6 in FIG. 5.

FIG. 4 illustrates the use of yet another embodiment of a retainer means according to the present invention. As illustrated, a retainer 71 is employed to retain an elastomeric connector 72 in operable position between a first set of spaced electrically conductive areas 74 located in the plane of circuit board 76 to a second set of electrically conductive areas, not illustrated but located on the bottom surface 78 of the illustrated alpha-numeric display panel 80. The retainer 71 generally comprises a planar body 82 of electrically non-conductive material having substantially parallel top and bottom surfaces 84 and 86 respectively. An aperture 88 extends through the body from the top surface 84 to the bottom surface 86, the aperture being linearly elongated in the planar dimension of the body 82. The aperture 88 has a cross-sectional dimension as previously discussed in connection with FIGS. 2 and 3. Lands 90 and 92 maintain the bottom surface 78 of the alpha-numeric display panel 80 in the desired position when the assembly is complete. Similar lands, not illustrated, on the bottom surface 86 of the retainer 71 maintain the elastomeric connector 72 in proper contact with the electrically conductive areas 74 on circuit board 76. Correct positioning of the retainer 71 with respect to the circuit board 76 is maintained by pin elements 94 fitting into apertures 96 on the circuit board 76. A bezel 98 covers and completes the assembly with the use of an appropriate fastening means extending through holes 100.

FIGS. 5 through 8 illustrate yet another retainer means according to this invention. The retainer means 102 there illustrated is specifically designed to contain and connect a large scale integrated circuit to an underlying printed circuit board to which the retainer 102 is mounted by means of mounting studs 104. The large-scale integrated circuit or LSI chip is retained within the retainer 102 by means of a closure or lid 106 having four locking flanges 108 which are received in key ways 110 existing on the inside surfaces of cavity-defining sidewalls 112. The lid 106 is locked in place by inserting a coin, screwdriver or other appropriate tool in slot 114 and rotating the lid 106 in the direction R.

Figure 7:
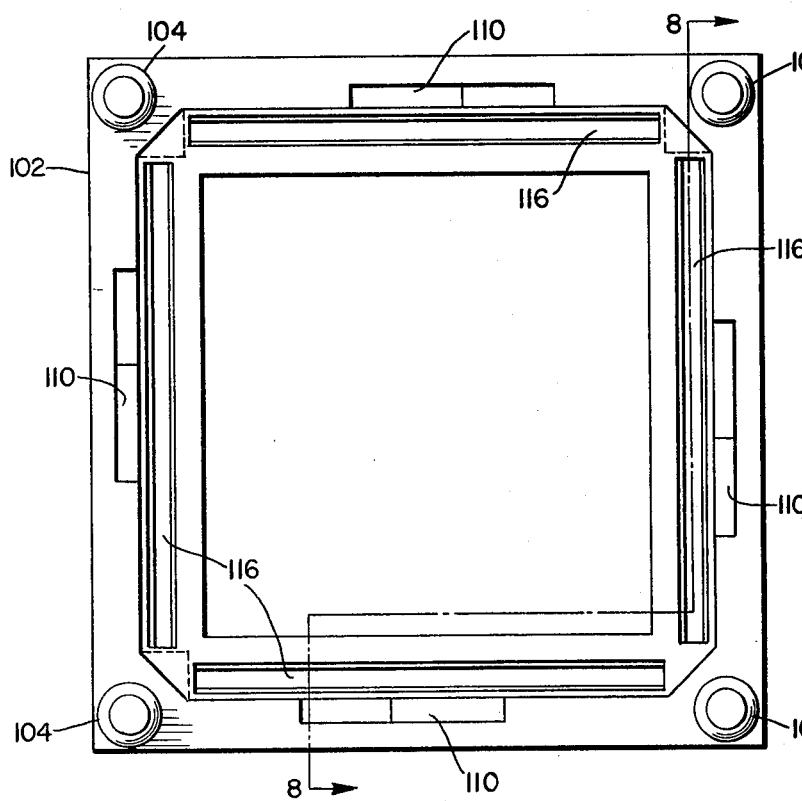
FIG. 7 is a bottom view of the LSI connector illustrated in FIG. 5.
Figure 8:
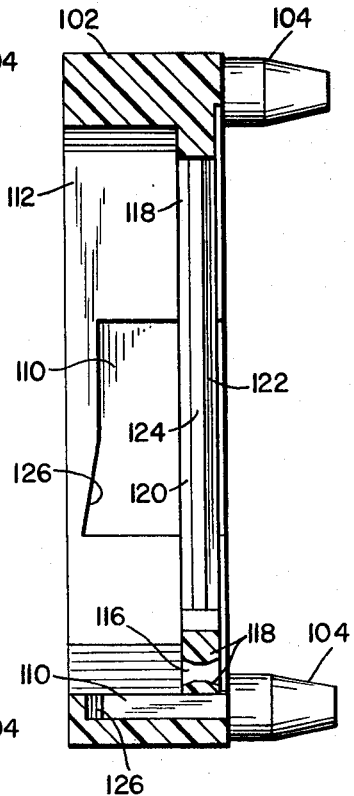
FIG. 8 is a sectional view of the LSI connector illustrated in FIG. 7 cut along section line 8—8.

FIGS. 7 and 8 illustrate the retainer means 102 with the lid 106 removed. As viewed from the bottom in FIG. 7, the retainer means is seen to include four linear apertures 116 for retaining the elastomeric electrical connectors. As may be more easily seen in FIG. 8, the apertures 116 each have a cross-section similar to that previously discussed with respect to FIGS. 2 and 3. Specifically, each aperture 116 is defined by a pair of separated linear sidewalls 118 with each sidewall being characterized by an upper and a lower region 120 and 122 separated by a central region 124, the central region 124 having a sidewall-to-sidewall dimension smaller than the end regions 120 or 122. The retainer 102 as illustrated in FIGS. 5 through 8 can be conveniently molded from any convenient electrically non-conductive plastic material and can be secured to a printed circuit board whenever desired by fastening means such as legs 104 extending through appropriate apertures in the circuit board and then heat sealed or cemented in place. The legs 104 can alternatively be replaced with apertures through which conventional screw-threaded fasteners or the like can be positioned and secured.

After the retainer means has been positioned with respect to the underlying circuit board, the strips of elastomeric electrical connector can be positioned within apertures 116 and the LSI chip deposited within the retainer 102. The lid 106 is then placed on top of the LSI chip and rotated in the direction R. As the locking lugs 108 engage inclined surfaces 126 of slots 110, the LSI chip is caused to be depressed against the internal biasing of the elastomeric electrical connectors as previously discussed with respect to FIG. 3 thereby insuring a positive electrical connection between the LSI chip and the underlying printed circuit board.

The length and angle of inclination of the inclined surfaces 126 together with the thickness of the elastomeric electrical connectors positioned within apertures 116 determine the extent to which the elastomeric electrical connectors will be compressed. The inclined surfaces 126 and locking lugs 108 can thus be viewed as performing the same function as lands 26, 28, 32, and 34 as illustrated in FIGS. 1-3; and the lands, inclined surfaces and locking lugs can be characterized generally as compression determining means for delimiting the compression experienced by the elastomeric electrical connector.

Although the invention has been described in considerable detail with reference to certain preferred embodiments thereof, it will be understood that variations and modifications can be effected within the spirit and scope of the invention as described above and as defined in the appended claims.

What is claimed is:

1. A large-scale integrated circuit chip retainer for connecting with elastomeric electrical contacts a large-scale integrated circuit chip to a printed circuit board, the retainer comprising:

a generally square planar body having an upper surface and a lower surface, four mounting studs extending from the lower surface of the square planar body at the corners thereof for engaging a printed circuit board, four upstanding sidewalls around the perimeter of the upper surface of the square planar body defining a cavity for receiving a large-scale integrated circuit chip, each upstanding sidewall having a horizontal slot on at least the inside surface thereof forming a keyway, four linearly elongated apertures for receiving the elastomeric electrical contacts through the planar body, each aperture being situated immediately adjacent and parallel to the inside surface of each corresponding upstanding sidewall, the apertures being in communication with said cavity, a removable, generally circular, planar closure for closing said cavity, the closure having on the perimeter thereof four flanges for engaging said horizontal slots in said sidewalls upon rotation of the closure with respect to the sidewalls thereby insuring any included large-scale integrated circuit chip contacts the elastomeric electrical contacts in the apertures connecting the same through the apertures to any underlying printed circuit board.

2. A large-scale integrated circuit chip connector for connecting a large-scale integrated circuit chip to a printed circuit board comprising:

a generally square planar body having an upper surface and a lower surface;

four mounting studs extending from the lower surface of the square planar body at the corners thereof for engaging a printed circuit board;

four upstanding sidewalls around the perimeter of the upper surface of the square planar body defining a cavity for receiving a large-scale integrated circuit chip, each upstanding sidewall having a horizontal slot on at least the inside surface thereof forming a keyway;

elastomeric electrical contact means, four linearly elongated apertures through the planar body for receiving the elastomeric electrical contact means, each aperture being situated immediately adjacent and parallel to the inside surface of each corresponding upstanding sidewall, the apertures being in communication with said cavity, and a removable, generally circular, planar closure closing said cavity, the closure having on the perimeter thereof four flanges for engaging said horizontal slots in said sidewalls upon rotation of the closure with respect to the sidewalls thereby insuring that any included large-scale integrated circuit chip contacts the elastomeric electrical contact means connecting the same through the apertures to any underlying printed circuit board.

3. The large-scale integrated circuit chip connector of claim 2 wherein the elastomeric electrical contact means includes elastomeric electrical contacts in the form of strips wherein each strip includes layered electrical contacts.

4. The large-scale integrated circuit chip connector of claims 1, 2, or 3 further including inclined surfaces extant between the flanges and the horizontal slots for urging the closure toward the four linearly elongated apertures as the closure is rotated, whereby any included large-scale integrated circuit chip is urged against the elastomeric electrical contacts.

* * * * *